United States Patent
Tzeng et al.

[11] Patent Number: 6,143,621
[45] Date of Patent: Nov. 7, 2000

[54] CAPACITOR CIRCUIT STRUCTURE FOR DETERMINING OVERLAY ERROR

[75] Inventors: Kuo-Chyuan Tzeng, Chu-pei; Wen-Jye Chung, Baw-Shian, both of Taiwan

[73] Assignee: Taiwan Semiconductor Manufacturing Company, Hsin-Chu, Taiwan

[21] Appl. No.: 09/332,382

[22] Filed: Jun. 14, 1999

[51] Int. Cl.⁷ .................................................. H01L 21/76
[52] U.S. Cl. .......................................... 438/401; 438/975
[58] Field of Search ...................... 438/401, 975; 148/DIG. 102

[56] References Cited

U.S. PATENT DOCUMENTS

| | | | |
|---|---|---|---|
| 4,538,105 | 8/1985 | Ausschnitt | 324/158 R |
| 4,647,850 | 3/1987 | Henderson et al. | 324/158 R |
| 5,617,340 | 4/1997 | Cresswell et al. | 364/571.01 |
| 5,699,282 | 12/1997 | Allen et al. | 364/571.01 |
| 5,879,866 | 9/1999 | Starikov et al. | 430/395 |
| 5,959,325 | 9/1999 | Adair et al. | 438/387 |

OTHER PUBLICATIONS

D.S. Perloff, "A Van Der Pauw Resistor Structure for Determining Mask Superposition Errors on Semiconductor Slices" in Solid State Electronics, Aug. 21, 1978, pp. 1013–1018.

*Primary Examiner*—Jey Tsai
*Attorney, Agent, or Firm*—George O. Saile; Stephen B. Ackerman

[57] ABSTRACT

A structure suitable for aligning two patterned conductive layers that are separated by a dielectric layer is described. Included in the lower pattern is a square and, as part of the upper pattern, four T-shaped capacitor electrodes are provided. The latter are positioned so that, when the alignment is exact, they all overlap the square by the same amount. Thus, under conditions of exact alignment, the capacitance value measured between any one of the top electrodes and the square will be the same for all electrodes. When, however, misalignment occurs, the degree of overlap will change, increasing on one side of the square while decreasing at the opposite side. In this way a comparison of measured capacitance values between electrodes located on opposing sides of the square will indicate whether, and what extent, misalignment has occurred.

11 Claims, 4 Drawing Sheets

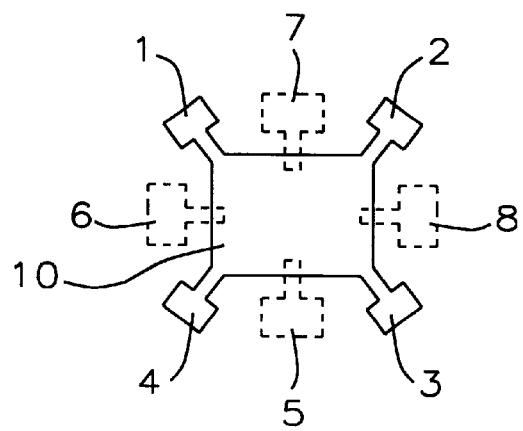
FIG. 1 - Prior Art
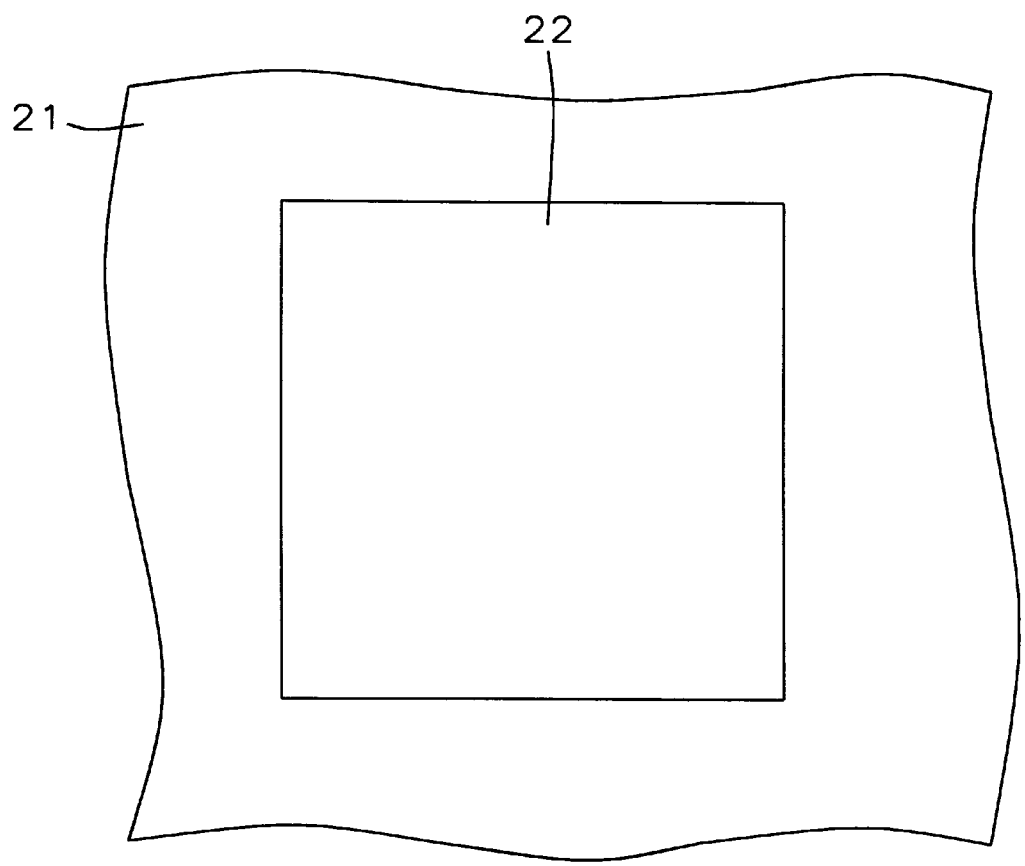
FIG. 2

CAPACITOR CIRCUIT STRUCTURE FOR DETERMINING OVERLAY ERROR

FIELD OF THE INVENTION

The invention relates to the general field of integrated circuit manufacture with particular reference to alignment between masks.

BACKGROUND OF THE INVENTION

Integrated circuits are formed by laying down multiple layers of various materials including conductors, semiconductors, and dielectrics. In most cases, any given layer is etched through a suitable mask (generally a contact mask of photoresist) before the next layer is deposited. Since the different layers of the integrated circuit form a unified whole, it is clear that the pattern into which a newly deposited layer is formed must be carefully aligned with respect to the pattern already present in the layer below.

A number of techniques have been developed for effecting layer to layer alignment quickly and accurately. In all cases, some sort of alignment mark is provided in the upper pattern and this must line up in the correct fashion with respect to an alignment mark already present in the lower pattern. This is most readily accomplished by observation under a microscope but, for manufacturing purposes, this is method too slow. Alignment is therefore performed by use of machines that, once set up, can be depended upon to continue to provide good alignment.

No machines are perfect so it is necessary to be able to check, quickly and accurately with minimum process disruption, on how good the actual alignment is at any particular point in time between any two masks. When the two patterns whose alignment is to be checked are both made of conductive material and the two layers will be in contact with one another, the approach described by D. S. Perloff in Solid state electronics 21, August 1978—"A Van der Pauw structure for determining mask superposition errors on semiconductor slice" has been generally used.

Perloff's structure is illustrated in FIG. 1. A metallic square 10 is etched out of the lower metal layer and includes contact arms I through 4. After the second layer has been laid down, a set of contacting plates 5–8 is etched out of it as part of the upper pattern. If thief alignment between the two layers is correct, then the resistance measured between the various upper and lower contacting points should be symmetrical. For example, $R_{45}$ should be the same as $R_{35}$ if contact plate 5 is exactly midway between 3 and 4. Should some horizontal misalignment have occurred, then plate 5 will be closer to 3 than to 4 (or vice versa) and differences in the two resistance readings will be seen. Similar considerations apply to vertical misalignment. This description is over-simplified but the basic requirement that the two patterned layers must be in contact with each other is always present.

It is, however, sometimes the case that there is a layer of a dielectric material between the two conductive materials. Clearly, in such a case, the Perloff approach is not applicable. The present invention offers a solution to this problem.

A routine search of the prior art was made but all the references that were identified were found to be variations on and improvements of the basic Perloff method discussed above. For example, Ausschnitt (U.S. Pat. No. 4,538,105) uses four rather than two conductors, but the principle is the same. Allen et al. (U.S. Pat. No. 5,699,282) uses a reference test structure to improve the quality of the measurements. Cresswell et al. (U.S. Pat. No. 5,617,340) also describe the use of reference standards while Henderson et al. (U.S. Pat. No. 4,647,850) use a U-shaped structure with a contacting bar that does not touch the arms of the U when alignment is correct. Thus, the prior art has not, to our knowledge, provided a solution to the problem of aligning patterns of conductive material that are separated by a dielectric layer.

SUMMARY OF THE INVENTION

It has been a object of the present invention to provide a structure suitable for aligning two patterns formed in two conductive layers separated by a dielectric layer.

Another object of the invention has been to provide a process for manufacturing said structure together with a method for utilizing it during alignment.

A further object of the invention has been that said method be suitable for automating.

These objects have been achieved by including in the lower pattern a square and, as part of the upper pattern, four T-shaped capacitor electrodes. The latter are positioned so that, when the alignment is exact, they all overlap the square by the same amount. Thus, under conditions of exact alignment, the capacitance value measured between any one of the top electrodes and the square will be the same for all. When, however, misalignment occurs, the degree of overlap will change, increasing on one side of the square while decreasing at the opposite side. In this way a comparison of measured capacitance values between electrodes located on opposing sides of the square will indicate whether, and what extent, misalignment has occurred.

BRIEF DESCRIPTION OF THE DRAWINGS

FIG. 1 shows a structure of the prior art suitable for aligning two conductive layers that are in contact with one another.

FIG. 2 shows the lower pattern used by the structure of the present invention for aligning two conductive layers that are separated by a dielectric layer.

DESCRIPTION OF THE PREFERRED EMBODIMENTS

The starting point for the manufacture of the structure of the present invention is schematically illustrated in FIG. 2. Semiconductor wafer 21 (generally, but not necessarily silicon) in which portions of an integrated circuit may already have been formed, is coated with a conductive material such as doped silicon, doped polysilicon, or a metal to a thickness between about 500 and 10,000 Angstrom and then patterned and etched to form a pattern of subcomponents for the integrated circuits, as required at this particular stage of thief manufacturing process.

Square 22 is included as part of this pattern. It is located where it will not interfere with the final operation of the integrated circuits. The exact shape may not be a square as, for example, there will be contacting leads attached to it, but, in terms of its function, it may be thought of as a square. Typically, square 22 would measure between about 10 and 1,000 microns on a side. Although only one instance of square 22 is shown in FIG. 2, it is usually advantageous to place several instances on the wafer (for example in opposite corners of a chip image or field). For the method to work effectively, the minimum number of alignment squares such as 22 is 2 per field.

Next, dielectric layer 55 (see FIG. 5) is laid down over this first metal layer. Any of several dielectric materials, including silicon oxide, silicon nitride, and silicon oxynitride may be used and the thickness of this layer is between about 35 and 500 Angstroms.

Figure 3:
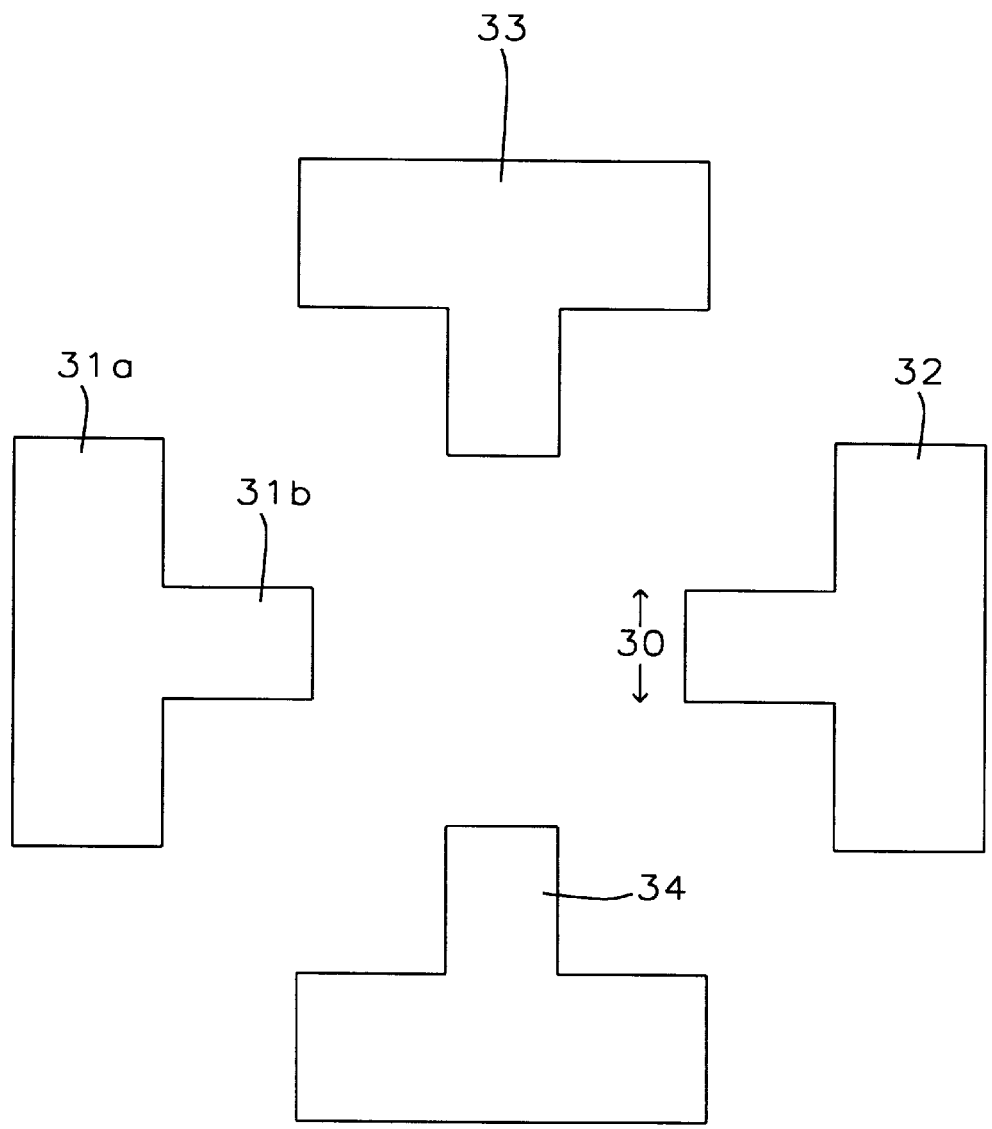
FIG. 3 shows the upper pattern that is used in conjunction with the pattern shown in FIG. 2.

Referring now to FIG. 3, a second conductive layer, selected from such materials as silicides, polysilicon, or a metal is deposited on the dielectric layer to a thickness between about 500 and 10,000 Angstroms and then patterned and etched to form a second pattern of subcomponents for the integrated circuits, as needed at this particular level. As part of this second pattern, four T-shaped capacitor plates 31–34 are formed. Each capacitor plate is made up of a contact area such as 31a and a capacitor area such as 31b.

Figure 4:
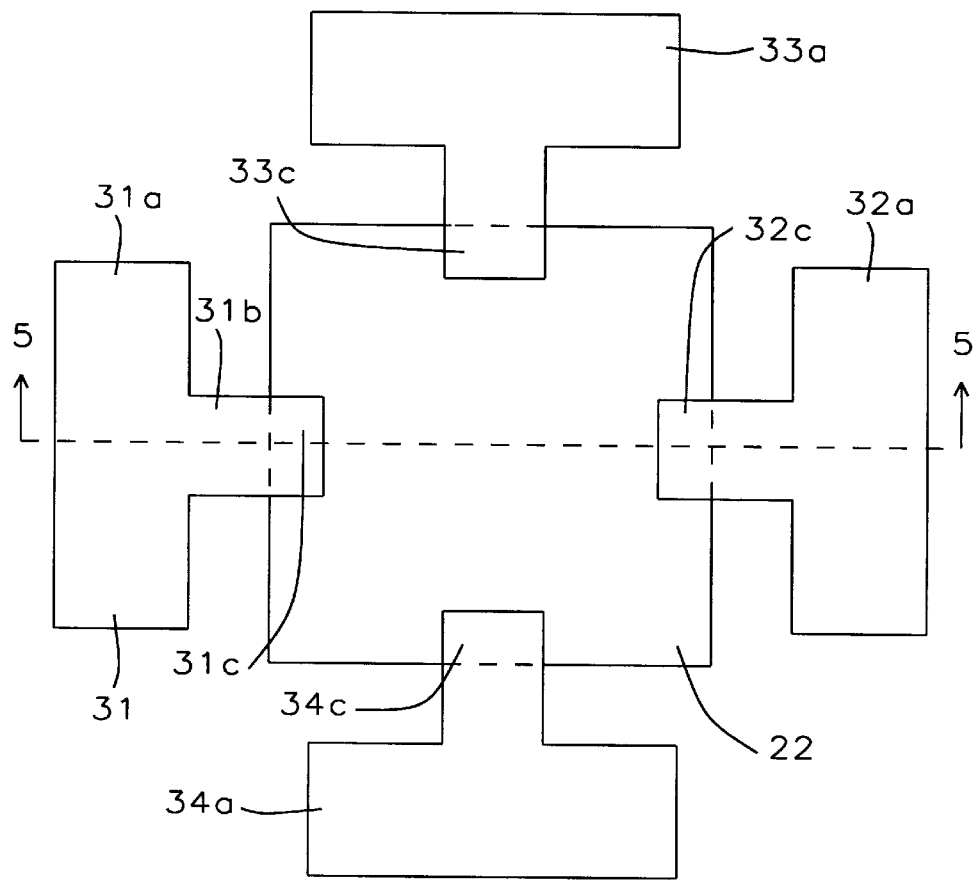
FIG. 4 shows the relative positions of the lower and upper patterns when they are in exact alignment.
Figure 5:
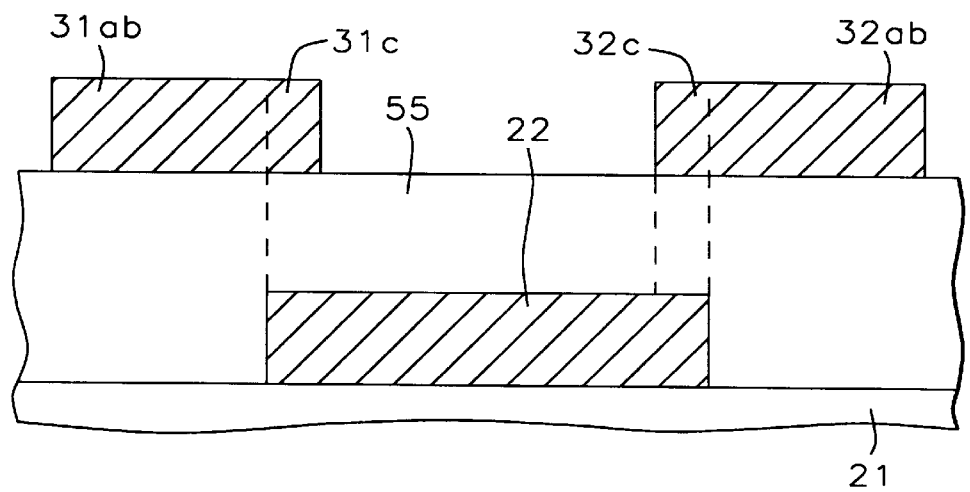
FIG. 5 is a cross-section through FIG. 4, illustrating how the top and bottom patterns form a capacitor.

The capacitor plates 31–34 all have the vertical leg portions of their T-shapes extending inwards and they are positioned so that when the upper and lower patterns are in exact alignment, they all overlap the sides of square 22 by the same amount (such as 31c) which is typically by between about 5 and 500 microns in the horizontal direction and between about 5 and 500 microns in the vertical direction. Each capacitor plate has the same width 30, which is between about 5 and 500 microns. A section taken through 5—5 in FIG. 4 is shown in FIG. 5.

Under conditions of exact alignment, the capacitor areas 31c–34c all have equal area (by definition) and lie over a dielectric layer of uniform thickness, so their measured capacitances will all be the same. If, however, misalignment between the two patterns has occurred, this will no longer be the case.

Figure 6:
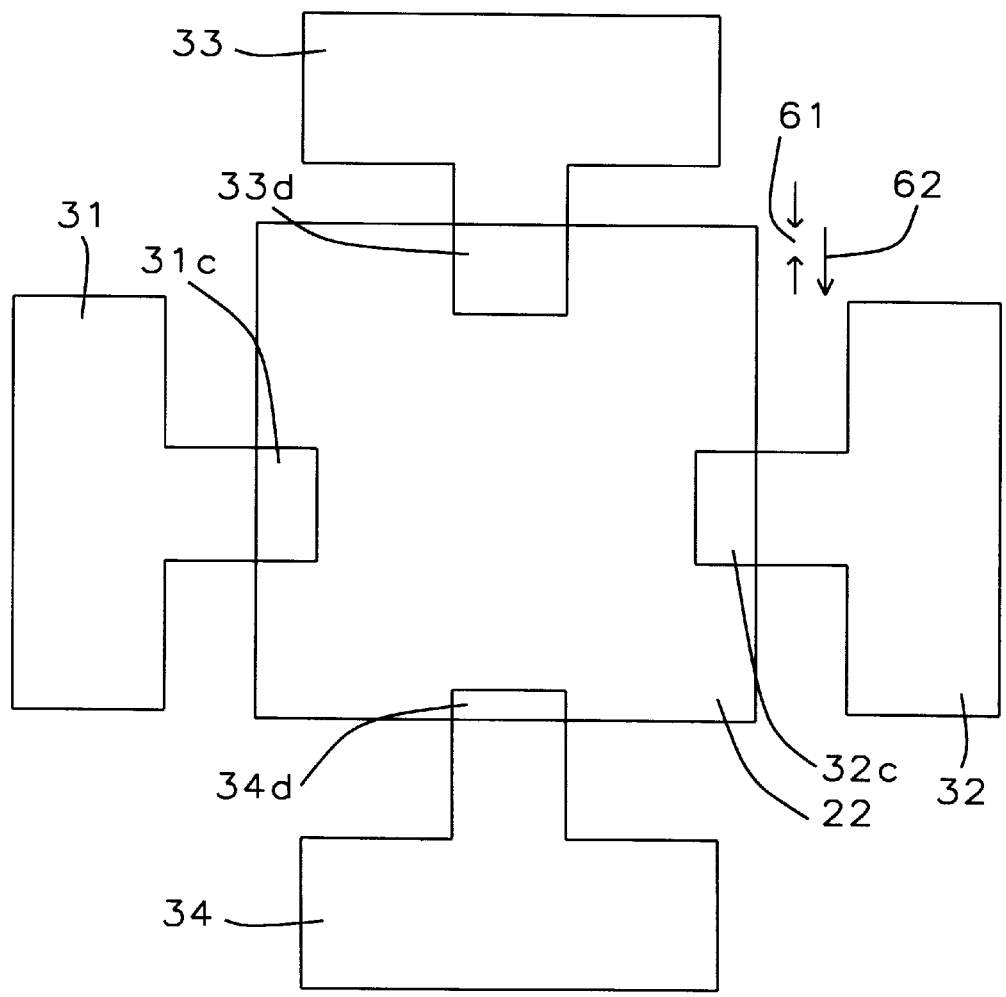
FIG. 6 shows the effect of vertical misalignment on the relative positions of the two patterns.

We illustrate this with reference to FIG. 6. This is similar to FIG. 4 except that some, vertical misalignment has occurred. As can be seen, the top pattern has shifted in the vertical direction (symbolized by arrow 62) by an amount 61. As a result, the overlapping portion of capacitor plate 33 (shown now as area 33d) has increased by an amount 61 while the overlapping portion of capacitor plate 34 (shown now as area 34d) has decreased by the same amount.

Thus, the difference between the measured capacitances for 33 and 34 is directly proportional to the degree of vertical misalignment. Similar considerations apply to measuring the amount of horizontal misalignment, if any. Typically the measured capacitance of any single plate (under conditions of exact alignment) is between about 20 and 500 femtofarads and differences between them as low as about 10 femtofarads are readily detectable (for example, by making the capacitors part of a bridge circuit). This implies that the minimum amount of linear misalignment detectable along a given direction is between about 500 and 5,000 Angstroms.

While the invention has been particularly shown and described with reference to the preferred embodiments thereof, it will be understood by those skilled in the art that various changes in form and details may be made without departing from the spirit and scope of the invention.

What is claimed is:

1. A method for determining overlay error during the manufacture of integrated circuits, comprising:

providing a semiconductor wafer having a partially completed integrated circuit and a topmost first conductive layer;

patterning and etching said first conductive layer to form a first pattern of subcomponents for the integrated circuits;

as part of said first pattern, including a square having vertical and horizontal sides;

depositing a dielectric layer over said first conductive layer;

depositing a second conductive layer on the dielectric layer;

patterning and etching said second conductive layer to form a second pattern of subcomponents for the integrated circuits;

as part of said second pattern, forming four capacitor plates, each of which further comprises a contact area and a capacitor area;

locating two of said capacitor plates whereby their contact areas are outside opposing vertical sides of the square and their capacitor areas extend inwards, overlapping said vertical sides by a first amount that is the same for both plates under conditions of exact alignment between the first and second patterns;

locating the other two capacitor plates whereby their contact areas are outside opposing horizontal sides of the square and their capacitor areas extend inwards, overlapping said horizontal sides by a second amount that is the same for both plates under conditions of exact alignment between the first and second patterns;

measuring the capacitance between each capacitor plate and the square; and determining the overlay error from the differences in capacitance value between opposing capacitor plates.

2. The method of claim 1 wherein the first conductive layer is selected from the group consisting of doped silicon, doped polysilicon, and metals.

3. The method of claim 1 wherein the dielectric layer is selected from the group consisting of silicon oxide, silicon nitride, and silicon oxynitride.

4. The method of claim 1 wherein the dielectric layer is deposited to a thickness between about 35 and 500 Angstroms.

5. The method of claim 1 wherein the second conductive layer is selected from the group consisting of doped silicon, doped polysilicon, and metals.

6. The method of claim 1 wherein the square measures between about 10 and 1,000 micrcons on a side.

7. The method of claim 1 wherein said first amount of overlap is between about 5 and 500 microns.

8. The method of claim 1 wherein said second amount of overlap is between about 5 and 500 microns.

9. The method of claim 1 wherein the capacitance between a single capacitance plate and the square is between about 20 and 500 femtofarads.

10. The method of claim 1 wherein at least 2 squares and their accompanying capacitor plates are used.

11. The method of claim 1 wherein the minimum amount of misalignment detectable along a given direction is between about 500 and 5,000 Angstroms.

* * * * *